United States Patent
Won et al.

(10) Patent No.: US 9,087,748 B2
(45) Date of Patent: Jul. 21, 2015

(54) THIN FILM TRANSISTOR SUBSTRATE AND LIQUID CRYSTAL DISPLAY INCLUDING THE SAME

(71) Applicant: Samsung Display Co., Ltd., Yongin, Gyeonggi-Do (KR)

(72) Inventors: Joo-Yeon Won, Seoul (KR); Yun Hee Kwak, Hwaseong-si (KR); Sung-Dong Park, Asan-si (KR); Chong Guk Lee, Seoul (KR); Byung Goo Jung, Goyang-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/333,747

(22) Filed: Jul. 17, 2014

(65) Prior Publication Data

US 2015/0054165 A1   Feb. 26, 2015

(30) Foreign Application Priority Data

Aug. 21, 2013 (KR) ........................ 10-2013-0099153

(51) Int. Cl.
| | |
|---|---|
| *H01L 27/13* | (2006.01) |
| *H01L 27/12* | (2006.01) |
| *G02F 1/1362* | (2006.01) |
| *H01L 23/528* | (2006.01) |

(52) U.S. Cl.
CPC ........ *H01L 27/124* (2013.01); *G02F 1/136259* (2013.01); *H01L 23/528* (2013.01); *G02F 2001/136272* (2013.01)

(58) Field of Classification Search
CPC .............. G02F 1/136259; G02F 2001/136272; H01L 23/528; H01L 27/124
USPC .......................................................... 257/773
See application file for complete search history.

(56) References Cited

U.S. PATENT DOCUMENTS

| | | | |
|---|---|---|---|
| 6,111,558 A * | 8/2000 | Jeung et al. ...................... 345/93 |
| 2004/0070700 A1 | 4/2004 | Sah et al. | |
| 2005/0195338 A1 * | 9/2005 | Matsumoto et al. ............ 349/40 |
| 2008/0018636 A1 * | 1/2008 | Chang ............................ 345/211 |
| 2009/0021665 A1 * | 1/2009 | Shiao et al. ...................... 349/54 |
| 2009/0115959 A1 * | 5/2009 | Lee et al. ....................... 349/192 |
| 2010/0214503 A1 | 8/2010 | Lee et al. | |

(Continued)

FOREIGN PATENT DOCUMENTS

| | | |
|---|---|---|
| JP | 4121310 B2 | 5/2008 |
| KR | 1020080022716 A | 3/2008 |

(Continued)

*Primary Examiner* — Allan R Wilson
(74) *Attorney, Agent, or Firm* — Cantor Colburn LLP (57) ABSTRACT

A thin film transistor substrate includes: first and second driving chips; a plurality of signal lines respectively connected to the first and second driving chips; a plurality of first and second branch repair lines extended across the plurality of signal lines connected to the first driving chip; a plurality of third and fourth branch repair lines extended across the plurality of signal lines connected to the second driving chip; an insulating layer between the plurality of first and second branch repair lines and the plurality of signal lines connected to the first driving chip, and between the plurality of third and fourth branch repair lines and the plurality of signal lines connected to the second driving chip; a first repair line connecting the first and second branch repair lines to each other; and a second repair line connecting the third and fourth branch repair lines to each other.

20 Claims, 5 Drawing Sheets

(56) References Cited

U.S. PATENT DOCUMENTS

2011/0278574 A1 11/2011 Chuang et al.
2013/0155342 A1 6/2013 Wu

FOREIGN PATENT DOCUMENTS

| KR | 1020080026277 A | 3/2008 |
| KR | 1020130042489 A | 4/2013 |

* cited by examiner

THIN FILM TRANSISTOR SUBSTRATE AND LIQUID CRYSTAL DISPLAY INCLUDING THE SAME

This application claims priority to Korean Patent Application No. 10-2013-0099153 filed on Aug. 21, 2013, and all the benefits accruing therefrom under 35 U.S.C. §119, the entire contents of which are incorporated herein by reference.

BACKGROUND (a) Field

The invention relates to a thin film transistor substrate and a liquid crystal display including the same.

(b) Description of the Related Art

A display device includes a color filter substrate on which a color filter array is disposed, attached to a thin film transistor substrate on which a thin film transistor array is disposed formed, with a liquid crystal therebetween. A common electrode receiving a common voltage is disposed on an entire surface of the color filter substrate and a plurality of pixel electrodes individually receiving data signals is disposed on the thin film transistor substrate in a matrix form. Further, a thin film transistor for individually driving the plurality of pixel electrodes, a gate line for controlling the thin film transistor, and a data line for supplying a data signal to the thin film transistor are further disposed on the thin film transistor substrate.

Since signal lines including the gate line and the data line disposed on the thin film transistor substrate have relatively small widths equal to or smaller than several micrometers, relative to an elongated direction of the signal lines, a disconnection defect may occur. Accordingly, the thin film transistor substrate further includes a repair line for repairing a disconnected signal line.

SUMMARY

One or more exemplary embodiment of the invention provides a plurality of repair lines which enables local repair to a signal line and reduces a length of the repair lines.

An exemplary embodiment of the invention provides a thin film transistor substrate including: first and second driving chips; a plurality of signal lines respectively connected to the first and second driving chips; a plurality of first and second branch repair lines extended across the plurality of signal lines connected to the first driving chip; a plurality of third and fourth branch repair lines extended across the plurality of signal lines connected to the second driving chip; an insulating layer between the plurality of first and second branch repair lines and the plurality of signal lines connected to the first driving chip, and between the plurality of third and fourth branch repair lines and the plurality of signal lines connected to the second driving chip; a first repair line configured to connect the first and second branch repair lines to each other; and a second repair line configured to connect the third and fourth branch repair lines to each other.

The plurality of first to fourth branch repair lines may respectively be parallel to each other.

The thin film transistor substrate may further include an auxiliary repair line parallel and adjacent to the second branch repair lines, and the plurality of fourth branch repair lines may be connected to the second repair lines via the auxiliary repair line.

The auxiliary repair line may not cross the plurality of signal lines connected to the first driving chip.

A width of the auxiliary repair line taken perpendicular to an extension direction thereof, may be smaller than that of the second repair line.

Distal first ends of the plurality of fourth branch repair lines may be separated from each other, and second ends of the plurality of fourth branch repair lines opposite to the first ends thereof, may be connected to each other via the auxiliary repair line.

Distal first ends of the plurality of second branch repair lines may be separated from each other, and second ends of the plurality of second branch repair lines opposite to the first ends thereof, may be connected to each other via the first repair line.

Distal first ends of the plurality of first branch repair lines may be separated from each other, second ends of the plurality of first branch repair lines opposite to the first ends thereof, may be connected to each other, distal first ends of the plurality of third branch repair lines may be separated from other, and second ends of the plurality of third branch repair lines opposite to the first ends thereof, may be connected to each other.

The plurality of first branch repair lines may be connected to each other via a first connection line, and the plurality of third branch repair lines may be connected to each other via a second connection line.

The second ends of each of the plurality of first and third branch repair lines may be connected to the first and second driving chips, respectively, and the connection may be within the driving chips.

Another exemplary embodiment of the invention provides a liquid crystal display including: a thin film transistor substrate including: first and second driving chips; a plurality of signal lines respectively connected to the first and second driving chips; a plurality of first and second branch repair lines extended across the plurality of signal lines connected to the first driving chip; a plurality of third and fourth branch repair lines extended across the plurality of signal lines connected to the second driving chip; an insulating layer between the plurality of first and second branch repair lines and the plurality of signal lines connected to the first driving chip, and between the plurality of third and fourth branch repair lines and the plurality of signal lines connected to the second driving chip; a first repair line configured to connect the first and second branch repair lines to each other; and a second repair line configured to connect the third and fourth branch repair lines to each other; a circuit board; and a flexible printed circuit film configured to connect the thin film transistor substrate and the circuit board to each other.

The plurality of first branch repair lines may be connected to each other via a first connection line, the plurality of third branch repair lines may be connected to each other via a second connection line, the first connection line may be connected to the first repair line via the first driving chip, the flexible printed circuit film and the circuit board, and the second connection line may be connected to the second repair line via the second driving chip, the flexible printed circuit film and the circuit board.

The second ends of the plurality of first and third branch repair lines may be connected to the first and second driving chips, respectively, the second ends of the plurality of first repair lines may be connected to the first repair line via the first driving chip, the flexible printed circuit film and the circuit board, and the second ends of the plurality of third branch repair lines may be connected to the second repair line via the second driving chip, the flexible printed circuit film and the circuit boardsecond.

According to one or more exemplary embodiment of the invention, a plurality of branch repair lines is included, and disconnections of a plurality of signal lines can be repaired in one area.

According to one or more exemplary embodiment of the invention, the second branch repair lines in a first are does not cross the data lines corresponding to a second area. Therefore, a length of the second branch repair lines becomes shorter, and thus resistance according to a length of the second branch repair lines as a conducting wire is reduced.

BRIEF DESCRIPTION OF THE DRAWINGS

The above and other features of the disclosure will become more apparent by describing in further detail exemplary embodiments thereof with reference to the accompanying drawings, in which.

DETAILED DESCRIPTION

Hereinafter, the invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, connected may refer to elements being physically and/or electrically connected to each other. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

Spatially relative terms, such as "beneath," "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be described in detail with reference to the accompanying drawings.

Next, a liquid crystal display according to an exemplary embodiment of the invention will be described with reference to FIG. 1.

Figure 1:
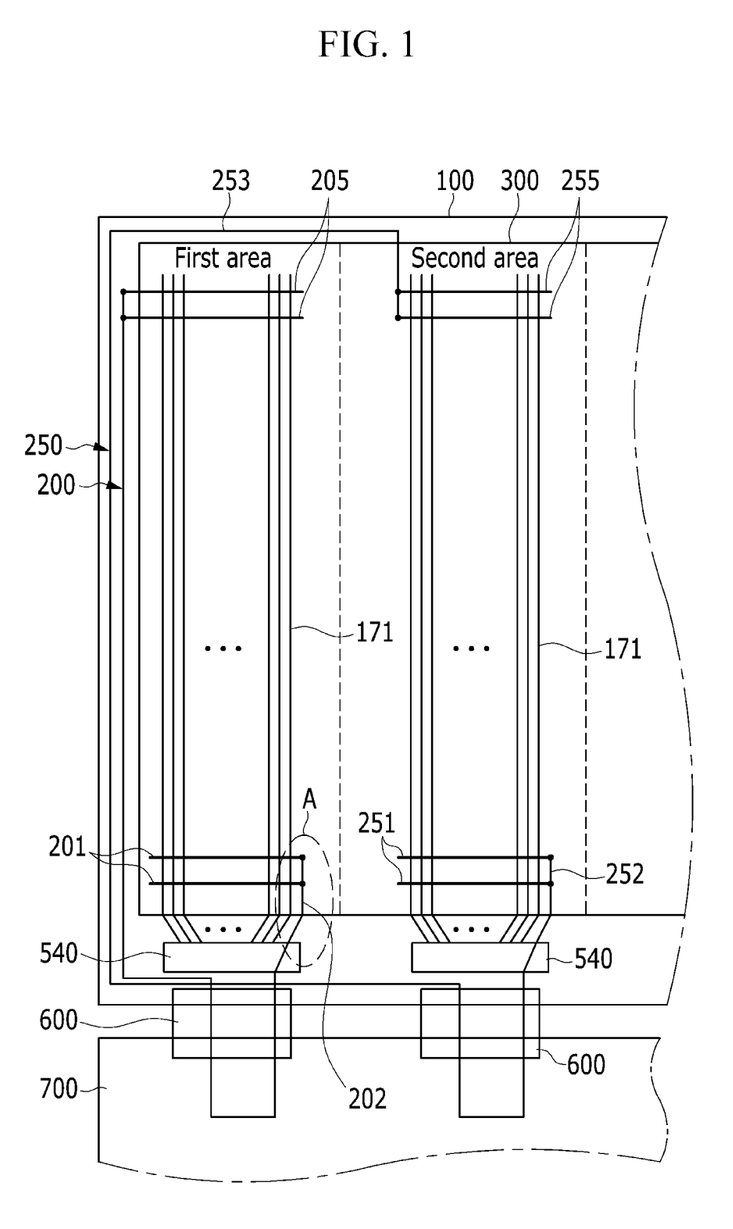
FIG. 1 is a top plan view schematically illustrating an exemplary embodiment of a liquid crystal display according to the invention.

FIG. 1 is a top plan view schematically illustrating an exemplary embodiment of a liquid crystal display according to the invention.

As illustrated in FIG. 1, a liquid crystal display includes a lower display panel 100, an upper display panel 300, a liquid crystal layer (not shown) located between the lower display panel 100 and the upper display panel 300, a flexible printed circuit film 600 (hereinafter, referred to as "FPC"), and a circuit board 700. The lower display panel 100 and the upper display panel 300 may each include a base substrate upon which elements thereof are disposed.

Hereinafter, each of the elements will be described in detail, and the lower display panel 100 will be first described.

An exemplary embodiment of the lower display panel 100 according to the invention may be a thin film transistor substrate. The lower display panel 100 includes a plurality of data driving chips 540, and first and second repair lines 200 and 250. Further, the lower display panel 100 includes a plurality of first branch repair lines 201, a plurality of second branch repair lines 205, a plurality of third branch repair lines 251, a plurality of fourth branch repair lines 255, first and second connection lines 202 and 252, a plurality of data lines 171, and an auxiliary repair line 253. According to the exemplary embodiment of the invention, the number of data driving chips 540 may correspond to the number of repair lines 200 and 250 in one-to-one correspondence.

The plurality of repair lines 200 and 250 are disposed along edges of the lower display panel 100 in a form of a ring. Further, the first and third branch repair lines 201 and 251 connected to the plurality of repair lines 200 and 250, respectively, and the second and fourth branch repair lines 205 and 255 connected to the plurality of repair lines 200 and 250, respectively, are disposed across (e.g., crossing or overlapping) a plurality of signal lines with an insulating layer therebetween. That is, the repair lines may be in a different layer of the thin film transistor substrate than the signal lines. The repair lines may be in a same layer of the thin film transistor substrate, but are not limited thereto. The signal lines may include scanning (or gate) and/or display signal lines, but are not limited thereto. According to the exemplary embodiment of the invention, the first and third branch repair lines 201 and 251 connected to the plurality of repair lines 200 and 250, respectively, and the second and fourth branch repair lines 205 and 255 connected to the plurality of repair lines 200 and 250, respectively, are extended to overlap the plurality of data lines 171 with an insulating layer therebetween.

The first and third branch repair lines 201 and 251 may be connected to first end of the repair lines 200 and 250 via the data driving chip 540, respectively. While the first and third branch repair lines 201 and 251 and the repair lines 200 and 250 are illustrated as a continuous line in FIG. 1, it will be understood that the first and third branch repair lines 201 and 251 and the repair lines 200 and 250 may be physically not connected to each other, such that the first and third branch repair lines 201 and 251 may be respectively connected to first end of the repair lines 200 and 250, via the data driving chip 540 physically and/or electrically disposed between the first branch repair lines 201 and the first end of the repair line 200, and between the third branch repair lines 251 and the first end of the repair line 250.

According to the exemplary embodiment of the invention, the first and third branch repair lines 201 and 251 may be connected to a respective data driving chip 540 via the first and second connection lines 202 and 252, respectively. The first and third branch repair lines 201 and 251 and/or the second and fourth branch repair lines 205 and 255, may be disposed in plural. Although the number of each of the first and third branch repair lines 201 and 251 and the number of each of the second and fourth branch repair lines 205 and 255 are two in the illustrated exemplary embodiment, the invention is not limited thereto. However, the following disclosure will describe two first branch repair lines 201, two third branch repair lines 251, two second branch repair lines 205, and two fourth branch repair lines 255 as an example.

A plurality of signal lines is attached to the lower display panel 100. The plurality of signal lines may include the plurality of data lines 171. Further, the lower display panel 100 may be divided into a plurality of areas so as to correspond to respective data driving chips 540. The data line 171 connected to each of the data driving chips 540 is arranged on each of the areas. Accordingly, the data lines 171 connected to a respective data driving chip 540 is arranged on each of the areas. Although the lower display panel 100 is divided into a first area and a second area in the illustrated exemplary embodiment, the invention is not limited thereto and may be applied to a lower display panel 100 including more or less areas.

The two first branch repair lines 201 are connected to the data driving chip 540 corresponding to the first area. The two first branch repair lines 201 are elongated parallel to each other. Further, distal first ends of the first branch repair lines 201 are separated from each other and second ends thereof opposite to the first ends are connected to each other. According to the exemplary embodiment of the invention, the second ends of the first branch repair lines 201 may be connected to each other via the first connection line 202.

The two third branch repair lines 205 are connected to the data driving chip 540 corresponding to the second area. The two third branch repair lines 251 are elongated parallel to each other. Further, distal first ends of the third branch repair lines 251 are separated from each other and second ends thereof opposite to the first ends are connected to each other. According to the exemplary embodiment of the invention, the second ends of the third branch repair lines 251 may be connected to each other via the second connection line 252.

Next, an exemplary embodiment of the first branch repair line according to the invention will be described with reference to FIGS. 2 and 3.

Figure 2:
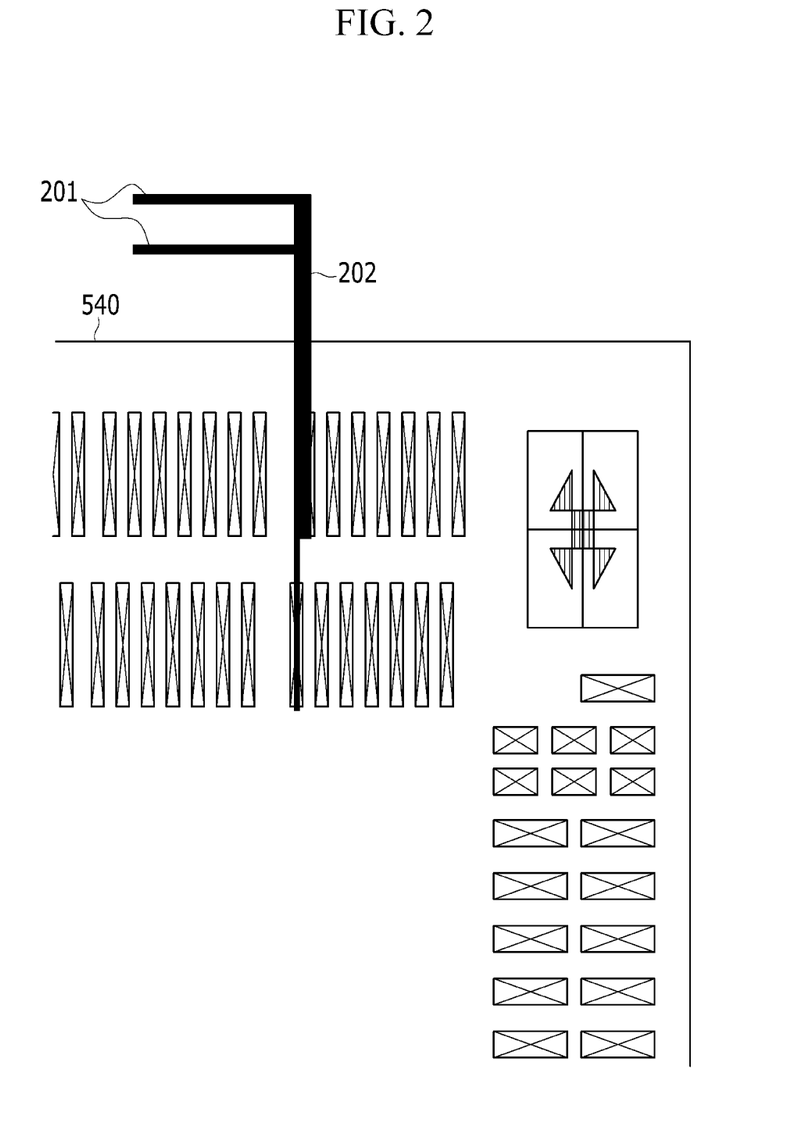
FIG. 2 is an enlarged view of an exemplary embodiment of area 'A' of FIG. 1 according to the invention.

FIG. 2 is an enlarged view of an exemplary embodiment of area 'A' of FIG. 1 according to the invention.

Although FIG. 2 describes the first branch repair line 205 corresponding to the first area as an example, the same description can be applied to the third branch repair line 251.

Referring to FIG. 2, the two first branch repair lines 201 are disposed parallel to each other and extend in a direction perpendicular to the plurality of data lines 171. The distal first ends of the two first branch repair lines 201 are separated from each other, and the second ends thereof opposite to the first ends are physically and/or electrically connected to each other. Further, the connected second ends of the first branch repair lines 201 are connected to an input terminal among a plurality of input terminals of the data driving chip 540. According to the exemplary embodiment of the invention, the second ends of the first branch repair lines 201 may be connected to each other via the first connection line 202, and the first branch repair lines 201 are connected to the data driving chip 540 via the first connection line 202. Further, the first connection line 202 may be physically and/or electrically connected to multiple terminals of the data driving chip 540. That is, the input terminals connected to the second ends of the first branch repair lines 205 are connected to each other via the first connection line 202.

Figure 3:
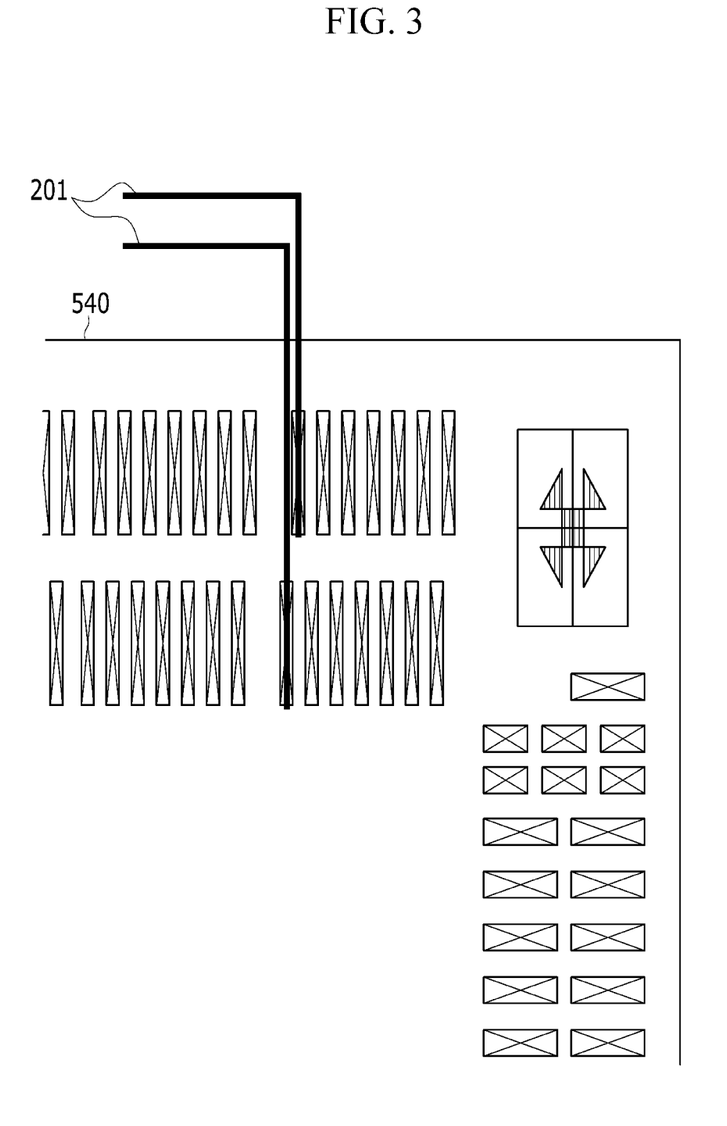
FIG. 3 is an enlarged view of another exemplary embodiment of area 'A' of FIG. 1 according to the invention.

FIG. 3 is an enlarged view of another exemplary embodiment of area 'A' of FIG. 1 according to the invention.

Referring to FIG. 3, the two first branch repair lines 201 are disposed parallel to each other and extend in a direction perpendicular to the plurality of data lines 171. The distal first ends of the two first branch repair lines 201 are separated from each other, and the second ends thereof opposite to the first ends are connected to each other via a terminal circuit. More specifically, the second ends of the first branch repair lines 201 are connected to different input terminals of the data driving chip 540. Each of the input terminals connected to the second ends of the first branch repair lines 205 is connected via a circuit within the data driving chip 540. In this case, according to the exemplary embodiment of the invention, the first connection line 202 may be omitted.

The invention will be described with reference to FIG. 1 again.

The first ends of the plurality of repair lines 200 and 250 may be connected to the data driving chips 540 via the FPC 600 and the circuit board 700. Further, in the exemplary embodiment of the invention, the first ends of the plurality of repair lines 200 and 250 according to may be connected to the first and third branch repair lines 201 and 251 via the data driving chip 540, respectively, as described above. According to the exemplary embodiment of the invention, the first and third branch repair lines 201 and 251 may be connected to the data driving chip 540 via the first and second connection lines 202 and 252, respectively. While the repair lines 200 and 250 are illustrated as a continuous line in FIG. 1, it will be understood that the repair lines 200 and/or 250 may be disconnected at portions thereof, such that disconnected portions of the repair lines 200 and 250 may be connected to each other via the FPC 600 and the circuit board 700. In one exemplary embodiment, the FPC 600 and/or the circuit board 700 may be physically and/or electrically disposed between the disconnected portions of the repair lines 200 and 250 such that the first ends of the plurality of repair lines 200 and 250 may be connected to the data driving chips 540.

In exemplary embodiment of the invention, the first and third branch repair lines 201 and 251 are connected to one or more input terminal of the data driving chip 540. The first end of each of the plurality of repair lines 200 and 250 is connected to an output terminal of the data driving chip 540. The input terminal and the output terminal of the data driving chip 540 are connected to each other. According to the exemplary embodiment of the invention, each of the first and second connection lines 202 and 252 may be connected to the input terminal of the data driving chip 540, to connect the first and third branch repair lines 201 and 251 to one or more input terminal of the data driving chip 540.

A second end of the first repair line 200 opposite to the first end thereof and corresponding to the first area among the plurality of repair lines 200 and 250, is connected to the second branch repair lines 205. Distal first ends of the second branch repair lines 205 are separated from each other, and the second ends thereof opposite to the first ends are connected via the first repair line 200. The second branch repair lines 205 are parallel to each other and disposed across the data lines 171 corresponding to the first area. Further, the second branch repair lines 205 do not cross the data lines 171 corresponding to the second area. Accordingly, a length of the second branch repair line 205 becomes shorter, thereby reducing resistance according to a length of the second branch repair line 205 as a conducting wire.

In an exemplary embodiment of the invention, the first repair line 200 may be thinner than the first branch repair line 201 and/or the second branch repair line 205, in respective width directions thereof.

A second end of the second repair line 250 opposite to the first end thereof and corresponding to the second area among the plurality of repair lines 200 and 250, is connected to a first end of the auxiliary repair line 253. First distal ends of the fourth branch repair line 255 are separated from each other, and the second ends thereof opposite to the first ends are connected via a second end of the auxiliary repair line 253 opposite to the first end thereof. The fourth branch repair lines 255 are parallel to each other and disposed across the data lines 171 corresponding to the second area. Further, the fourth branch repair lines 255 do not cross the data lines 171 corresponding to the first area. Accordingly, a length of the fourth branch repair line 255 becomes shorter, thereby reducing resistance according to a length of the fourth branch repair line 255 as a conducting wire.

The auxiliary repair line 253 may be formed at an edge or outline of the lower display panel 100. The outline or peripheral area of the lower display panel 100 may be exposed by the upper display panel 300. Further, the auxiliary repair line 253 passes along the first area while being disposed in the outline of the lower display panel 100 to be connected to the fourth branch repair lines 255 of the second area. In addition, the auxiliary repair line 253 does not overlap the data lines 171. The auxiliary repair line 253 may be parallel to the second branch repair lines 205.

In an exemplary embodiment of the invention, the auxiliary repair line 253 of the second repair line 250 may be thinner than the third branch repair line 251 or the fourth branch repair line 255 in respective width directions thereof.

Each of the first to fourth branch repair lines 201, 205, 251 and 255 are extended in a length direction, and widths are taken perpendicular to the respective length direction. In an exemplary embodiment of the invention, widths of the first to fourth branch repair lines 201, 205, 251 and 255 may be the same as each other, but the invention is not limited thereto.

The auxiliary repair line 253, the first repair line 200 or the second repair line 250 formed at the edges of the lower display panel 100 may be thinner than the first and third branch repair lines 201 and 251 or the second and fourth repair lines 205 and 255 disposed across the data lines 171, in respective width directions thereof. Accordingly, a volume or planar area of the lower display panel 100 occupied by each of the lines 253, 200 and 250 may be smaller than that when an entire of a conductive line has the same thickness.

The FPC 600 receives an image signal and applies a driving signal to each of the data lines 171.

Next, an exemplary embodiment of a method of repairing a signal line according to the invention will be described with reference to FIG. 4.

Figure 4:
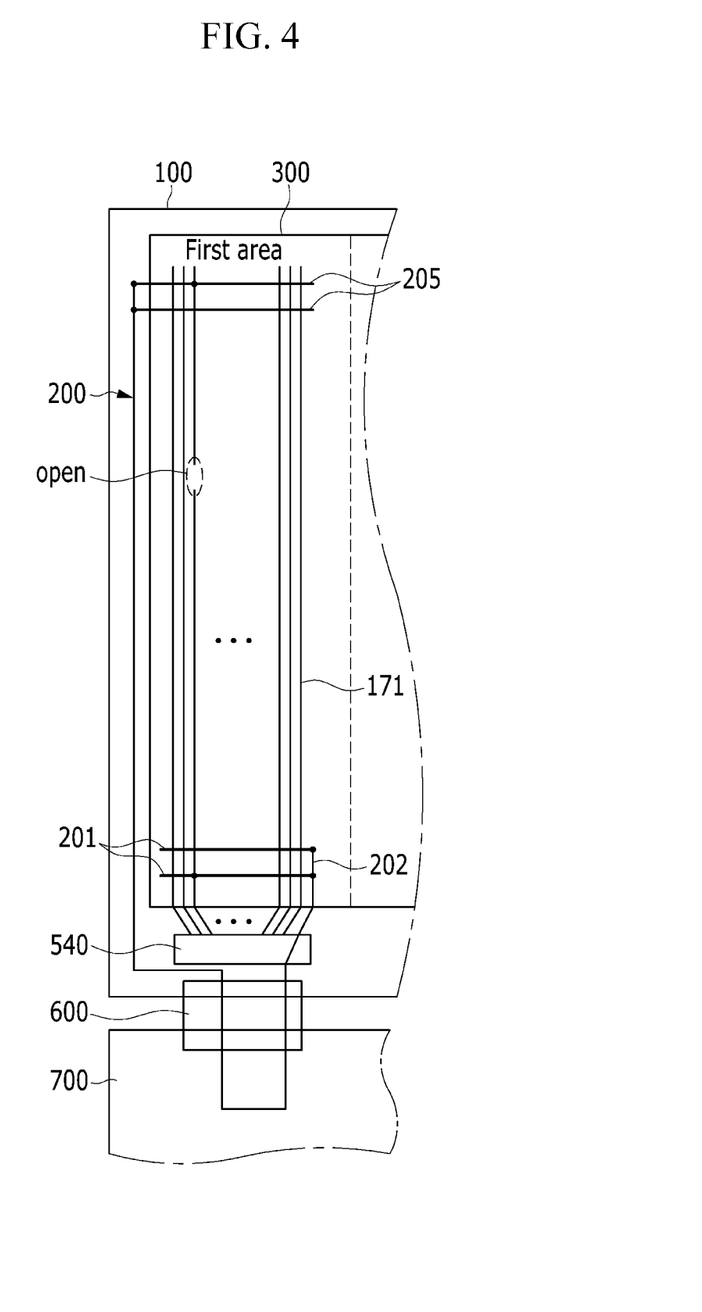
FIG. 4 is a top plan view schematically illustrating an exemplary embodiment of a first area of a liquid crystal display in which a signal line is repaired according to the invention.

FIG. 4 is a top plan view schematically illustrating an exemplary embodiment of a first area of a liquid crystal display in which a signal line is repaired according to the invention.

According to the exemplary embodiment of the invention, when a disconnected or broken signal line is repaired, the repair is made by connecting the two disconnected portions such as through laser welding an overlapping part between the first branch repair line 201 and the second branch repair line 205, and the disconnected signal line. As illustrated in FIG. 4, the repair is indicated by a dot at the intersection of the uppermost second branch repair line 205 and the disconnected data line 171, and at the intersection of the lowermost first branch repair line 201 and the disconnected data line 171.

Referring to FIG. 4, an overlapping part between one of the two first branch repair lines 201 and the disconnected data line 171 is short, when a data line 171 is disconnected ('open' in FIG. 4). Further, an overlapping part between one of the two second branch repair lines 205 and the disconnected data line 171 is also short. The disconnected data line 171 is repaired through such a method, as illustrated in FIG. 4 by the dots at the respective overlapping parts. When there is another disconnected data line 171 in the first area, the disconnected data line 171 is repaired by using an unused first branch repair line 201 and second branch repair line 205.

Figure 5:
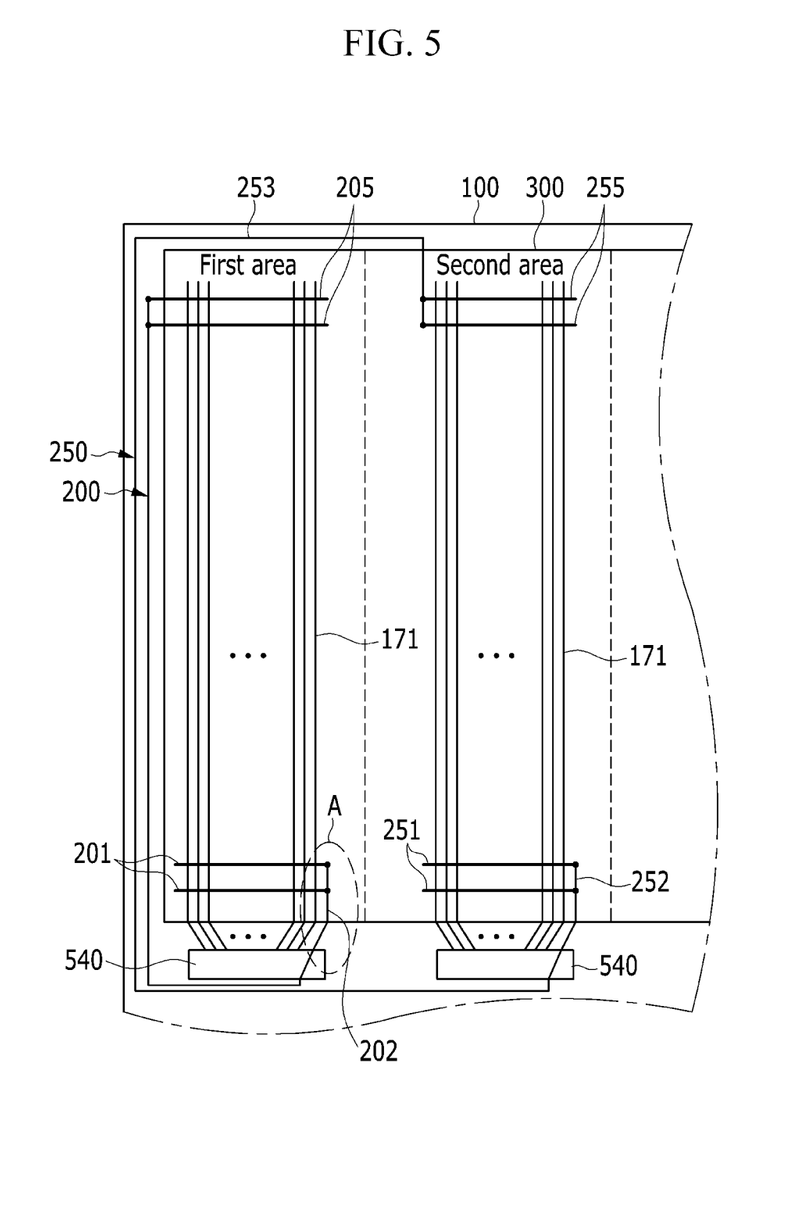
FIG. 5 is a top plan view schematically illustrating another exemplary embodiment of a liquid crystal display according to the invention.

FIG. 5 is a top plan view schematically illustrating another exemplary embodiment of a liquid crystal display according to the invention.

Referring to FIG. 5, the first repair line 200 and the second repair line 250 may not be connected to the FPC 600 and the circuit board 700. That is, the first repair line 200 and the second repair line 250 may be disposed only on the lower display panel 100. In other words, the first repair line 200 and the second repair line 250 may be directly connected to each of the data driving chips 540 by being disposed only on the lower display panel 100.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A thin film transistor substrate comprising:
   first and second driving chips;
   a plurality of signal lines respectively connected to the first and second driving chips;
   a plurality of first and second branch repair lines extended across the plurality of signal lines connected to the first driving chip;
   a plurality of third and fourth branch repair lines extended across the plurality of signal lines connected to the second driving chip;
   an insulating layer between the plurality of first and second branch repair lines and the plurality of signal lines connected to the first driving chip, and between the plurality of third and fourth branch repair lines and the plurality of signal lines connected to the second driving chip;
   a first repair line configured to connect the first and second branch repair lines to each other; and
   a second repair line configured to connect the third and fourth branch repair lines to each other,
   wherein the plurality of first branch repair lines is connected to each other.

2. The thin film transistor substrate of claim 1, wherein:
   the plurality of first to fourth branch repair lines is respectively parallel to each other.

3. The thin film transistor substrate of claim 2, further comprising an auxiliary repair line parallel and adjacent to the second branch repair lines,
   wherein:
   the plurality of fourth branch repair lines is connected to the second repair line via the auxiliary repair line.

4. The thin film transistor substrate of claim 3, wherein:
   the auxiliary repair line does not cross the plurality of signal lines connected to the first driving chip.

5. The thin film transistor substrate of claim 4, wherein:
   a width of the auxiliary repair line taken perpendicular to an extension direction thereof, is smaller than that of the second repair line.

6. The thin film transistor substrate of claim 5, wherein:
   distal first ends of the plurality of fourth branch repair lines are separated from each other, and
   second ends of the plurality of fourth branch repair lines opposite to the first ends thereof, are connected to each other via the auxiliary repair line.

7. The thin film transistor substrate of claim 6, wherein:
   distal first ends of the plurality of second branch repair lines are separated from each other, and
   second ends of the plurality of second branch repair lines opposite to the first ends thereof, are connected to each other via the first repair line.

8. The thin film transistor substrate of claim 7, wherein:
   distal first ends of the plurality of first branch repair lines are separated from each other,
   second ends of the plurality of first branch repair lines opposite to the first ends thereof, are connected to each other,
   distal first ends of the plurality of third branch repair lines are separated from other, and
   second ends of the plurality of third branch repair lines opposite to the first ends thereof, are connected to each other.

9. The thin film transistor substrate of claim 8, wherein:
   the plurality of first branch repair lines is connected to each other via a first connection line, and
   the plurality of third branch repair lines is connected to each other via a second connection line.

10. The thin film transistor substrate of claim 8, wherein:
    the second ends of the plurality of first and third branch repair lines are connected to the first and second driving chips, respectively, and the connection is made within the driving chips.

11. A liquid crystal display comprising:
    a thin film transistor substrate comprising:
      first and second driving chips;
      a plurality of signal lines respectively connected to the first and second driving chips;
      a plurality of first and second branch repair lines extended across the plurality of signal lines connected to the first driving chip;
      a plurality of third and fourth branch repair lines extended across the plurality of signal lines connected to the second driving chip;
      an insulating layer between the plurality of first and second branch repair lines and the plurality of signal lines connected to the first driving chip, and between the plurality of third and fourth branch repair lines and the plurality of signal lines connected to the second driving chip;
      a first repair line configured to connect the first and second branch repair lines to each other; and
      a second repair line configured to connect the third and fourth branch repair lines to each other,
      wherein the plurality of first branch repair lines is connected to each other;
    a circuit board; and
    a flexible printed circuit film configured to connect the thin film transistor substrate and the circuit board to each other.

12. The liquid crystal display of claim 11, wherein:
    the plurality of first to fourth branch repair lines is respectively parallel to each other.

13. The liquid crystal display of claim 12, further comprising an auxiliary repair line parallel and adjacent to the second branch repair lines,
    wherein:
    the plurality of fourth branch repair lines is connected to the second repair line via the auxiliary repair line.

14. The liquid crystal display of claim 13, wherein:
    the auxiliary repair line does not cross the plurality of signal lines connected to the first driving chip.

15. The liquid crystal display of claim 14, wherein:
    a width of the auxiliary repair line taken perpendicular to an extension direction thereof, is smaller than that of the second repair line.

16. The liquid crystal display of claim 15, wherein:
distal first ends of the plurality of fourth branch repair lines are separated from each other, and
second ends of the plurality of fourth branch repair lines opposite to the first ends thereof, are connected to each other via the auxiliary repair line.

17. The liquid crystal display of claim 16, wherein:
distal first ends of the plurality of second branch repair lines are separated from each other, and
second ends of the plurality of second branch repair lines opposite to the first ends thereof, are connected to each other via the first repair line.

18. The liquid crystal display of claim 17, wherein:
distal first ends of the plurality of first branch repair lines are separated from each other,
second ends of the plurality of first branch repair lines opposite to the first ends thereof, are connected to each other,
distal first ends of the plurality of third branch repair lines are separated from each other, and
second ends of the plurality of third branch repair lines opposite to the first ends thereof, are connected to each other.

19. The liquid crystal display of claim 18, wherein:
the plurality of first branch repair lines is connected to each other via a first connection line,
the plurality of third branch repair lines is connected to each other via a second connection line,
the first connection line is connected to the first repair line via the first driving chip, the flexible printed circuit film and the circuit board, and
the second connection line is connected to to the second repair line via the second driving chip, the flexible printed circuit film and the circuit board.

20. The liquid crystal display of claim 18, wherein:
the second ends of the plurality of first and third branch repair lines are connected to the first and second driving chips, respectively,
the second ends of the plurality of first repair lines are connected to the first repair line via the first driving chip, the flexible printed circuit film and the circuit board, and
the second ends of the plurality of third branch repair lines are connected to the second repair line via the second driving chip, the flexible printed circuit film and the circuit board.

\* \* \* \* \*